(12) United States Patent
Mahajan et al.

(10) Patent No.: US 11,398,565 B2
(45) Date of Patent: Jul. 26, 2022

(54) SILICON CONTROLLED RECTIFIER WITH A GATE ELECTRODE FOR ELECTROSTATIC DISCHARGE PROTECTION

(71) Applicant: GLOBALFOUNDRIES Singapore Pte. Ltd., Singapore (SG)

(72) Inventors: Prantik Mahajan, Dresden (DE); Raunak Kumar, Singapore (SG); Kyong Jin Hwang, Singapore (SG); Robert JR Gauthier, Jr., Williston, VT (US)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/114,391

(22) Filed: Dec. 7, 2020

(65) Prior Publication Data
US 2022/0181474 A1    Jun. 9, 2022

(51) Int. Cl.
*H01L 29/74*    (2006.01)
*H01L 29/06*    (2006.01)
*H01L 29/66*    (2006.01)
*H01L 29/423*    (2006.01)

(52) U.S. Cl.
CPC ...... *H01L 29/7436* (2013.01); *H01L 29/0653* (2013.01); *H01L 29/42308* (2013.01); *H01L 29/66393* (2013.01); *H01L 29/7432* (2013.01)

(58) Field of Classification Search
CPC ..... H01L 2924/13034–13035; H01L 27/0262; H01L 29/7436; H01L 29/66393
See application file for complete search history.

(56) References Cited

U.S. PATENT DOCUMENTS

| | | | |
|---|---|---|---|
| 4,937,647 | A | 6/1990 | Sutton |
| 6,144,070 | A | 11/2000 | Devore et al. |
| 6,894,349 | B2 | 5/2005 | Beasom |
| 7,071,528 | B2 | 7/2006 | Ker et al. |
| 2007/0069310 | A1 | 3/2007 | Song et al. |
| 2018/0211950 | A1* | 7/2018 | Chiu .................. H01L 27/0635 |
| 2021/0242198 | A1* | 8/2021 | Toyoda ................ H01L 29/739 |

OTHER PUBLICATIONS

Subrahmanya Teja et al., Split-gate architecture for higher breakdown voltage in STI based LDMOS transistors, 2017 International Conference on Electron Devices and Solid-State Circuits (EDSSC), 2017, IEEE.

(Continued)

*Primary Examiner* — Didarul A Mazumder
*Assistant Examiner* — Wasiul Haider
(74) *Attorney, Agent, or Firm* — David Cain

(57) ABSTRACT

A silicon controlled rectifier is provided. The silicon controlled rectifier comprises a substrate and a first n-well in the substrate. A p+ anode region may be arranged in the first n-well in the substrate. A first p-well may be arranged in the first n-well in the substrate. An n+ cathode region may be arranged in the first p-well in the substrate. A field oxide layer may be arranged over a first portion of the first p-well. A first gate electrode layer may extend over a second portion of the first p-well and over a portion of the field oxide layer.

20 Claims, 10 Drawing Sheets

(56) References Cited

OTHER PUBLICATIONS

Stefano Manzini et al., Electrical Characterization and Reliability of Split-Gate High-Voltage Transistors, IEEE Transactions on Device and Materials Reliability, 2018, pp. 279-283, vol. 18—Issue 2, IEEE.

Shen-Li Chen et al., ESD-Reliability Influences of an HV NLDMOS With Different Embedded SCR Structures in the Drain Side, International Journal of Electrical and Electronics Engineering Research (IJEEER), 2016, pp. 37-44, vol. 6—Issue 2, TJPRC Pvt. Ltd.

\* cited by examiner

SILICON CONTROLLED RECTIFIER WITH A GATE ELECTRODE FOR ELECTROSTATIC DISCHARGE PROTECTION

FIELD OF THE INVENTION

The disclosed embodiments relate generally to silicon controlled rectifiers, and more particularly, to silicon controlled rectifiers with a gate electrode for electrostatic discharge protection of high voltage and high speed input/output interfaces.

BACKGROUND

Semiconductor integrated circuits may be increasingly sensitive to higher voltages and/or higher current caused, for example, by static electricity or electrostatic discharge (ESD). The static electricity may be caused, for example, by contact with a human body. In some cases, a voltage and/or current in the integrated circuit caused by static electricity may destroy an insulating layer and/or short circuit a channel, which may disable the integrated circuit functionality.

Silicon controlled rectifier (SCR) devices may be used for electrostatic discharge (ESD) protection for high voltage input/output (I/O) nodes. However, high parasitic gate to anode capacitance in silicon controlled rectifier devices may limit their use in high speed input/output protection. It is also challenging to independently regulate a holding voltage of the silicon controlled rectifier device without increasing the device size or footprint. Thus, there is a need to overcome the challenges mentioned above.

SUMMARY

In an aspect of the present disclosure, a silicon controlled rectifier is provided. The silicon controlled rectifier comprises a substrate and a first n-well in the substrate. A p+ anode region may be arranged in the first n-well in the substrate. A first p-well may be arranged in the first n-well in the substrate. An n+ cathode region may be arranged in the first p-well in the substrate. A field oxide layer may be arranged over a first portion of the first p-well. A first gate electrode layer may be arranged over a portion of the field oxide layer and may extend over a second portion of the first p-well.

In another aspect of the present disclosure, a silicon controlled rectifier is provided. The silicon controlled rectifier comprises a substrate and a first n-well in the substrate. A p+ anode region may be arranged in the first n-well in the substrate. A first p-well may be arranged in the first n-well in the substrate. An n+ cathode region may be arranged in the first p-well in the substrate. A field oxide layer may be arranged over a first portion of the first p-well. A first gate electrode layer may extend over a second portion of the first p-well and over a portion of the field oxide layer. A gate dielectric layer may be arranged between the first gate electrode layer and the second portion of the first p-well. A p+ doped region may be arranged in the first p-well in the substrate.

In yet another aspect of the present disclosure, a method of fabricating a silicon controlled rectifier is provided. The method comprises providing a substrate and a first n-well in the substrate. A first p-well may be provided in the first n-well in the substrate. A field oxide layer may be provided over a first portion of the first p-well. A first gate electrode layer may be provided over a second portion of the first p-well and over a portion of the field oxide layer. A p+ anode region may be provided in the first n-well in the substrate. An n+ cathode region may be provided in the first p-well in the substrate.

Numerous advantages may be derived from the embodiments described below. The embodiments provide a silicon controlled rectifier with a low parasitic gate to anode capacitance, high holding voltage, low trigger voltage and high current handling capability. The silicon controlled rectifier is also isolated from other devices and regions in the semiconductor circuit by the first n-well. A second gate electrode of the silicon controlled rectifier enables independent regulation of the holding voltage without increase in the device size.

BRIEF DESCRIPTION OF THE DRAWINGS

The disclosed embodiments will be better understood from a reading of the following detailed description, taken in conjunction with the accompanying drawings.

Figure 1A:
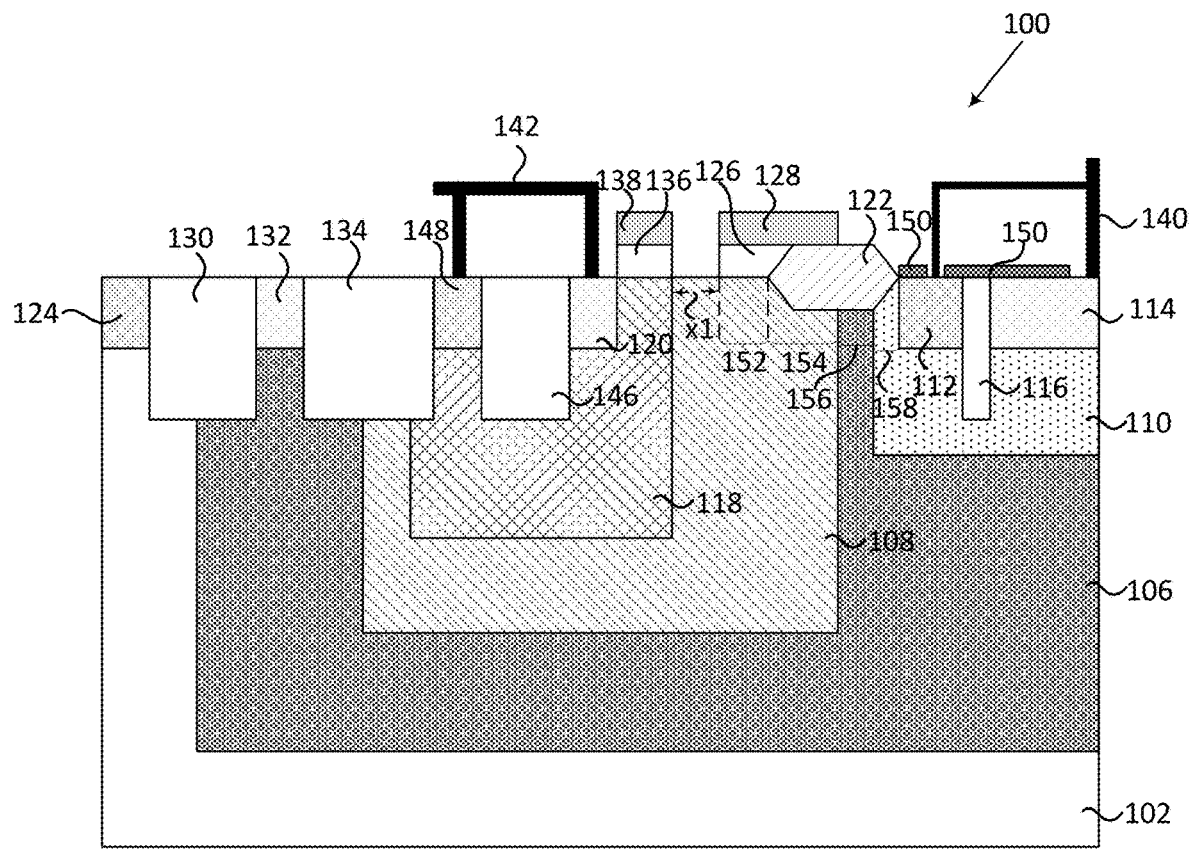
FIG. 1A is a cross-section view of a silicon controlled rectifier, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A is a cross-section view of a silicon controlled rectifier 100, according to an embodiment of the disclosure. Referring to FIG. 1A, the silicon controlled rectifier 100 comprises a substrate 102 and a first n-well 106 in the substrate 102. In an embodiment, the substrate 102 may be made of p-doped silicon. A first p-well 108 may be arranged in the first n-well 106. A second p-well 118 may be arranged in the first p-well 108. In one embodiment, the second p-well 118 may be more highly doped than the first p-well 108. A second n-well 110 may be arranged in the first n-well 106. In one embodiment, the second n-well 110 may be more highly doped than the first n-well 106. A p+ anode region 112 may be arranged in the first n-well 106 in one embodiment and in the second n-well 110 in a preferred embodiment. An n+ cathode region 120 may be arranged in the first p-well 108 in one embodiment and in the second p-well 118 in a preferred embodiment. A field oxide layer 122 may be arranged over a first portion 154 of the first p-well 108. The field oxide layer 122 may be arranged over a portion 156 of the first n-well 106 adjacent to the first portion 154 of the first p-well 108. The field oxide layer 122 may be arranged over a portion 158 of the second n-well 110 adjacent to the p+ anode region 112.

A first gate electrode layer 128 may extend over a second portion 152 of the first p-well 108 and over a portion of the field oxide layer 122. In an embodiment, the second portion 152 of the first p-well 108 may be adjacent to the first portion 154 of the first p-well 108. A first gate dielectric layer 126 may be arranged between the first gate electrode layer 128 and the second portion 152 of the first p-well 108. A second gate electrode layer 138 may be arranged over a portion of the second p-well 118 adjacent to the n+ cathode region 120. The first 128 and second 138 gate electrode layers may present separate and independent control of the silicon controlled rectifier 100. A second gate dielectric layer 136 may be arranged between the second gate electrode layer 138 and the second p-well 118. A portion of the first p-well 108 having a length x1 may be between the first gate electrode layer 128 and the second gate electrode layer 138. Increasing the length x1 may increase the holding voltage of the silicon controlled rectifier device 100. A p+ doped region 148 may be arranged in the first p-well 108 in one embodiment and in the second p-well 118 in a preferred embodiment. An isolation structure 146 may be arranged between the p+ doped region 148 and the n+ cathode region 120. In an embodiment, the isolation structure 146 may be a shallow trench isolation (STI). In an embodiment the p+ doped region 148 may be a contact for the second p-well 118. A line 142 may indicate an electrical connection between the n+ cathode region 120 and the p+ doped region 148. In another embodiment, the isolation structure 146 may be an optional feature. In another embodiment, the n+ cathode region 120 may be next to the p+ doped region 148. In another embodiment, a portion of the second p-well 118 may be between the n+ cathode region 120 and the p+ doped region 148. Although not shown, a contact may be formed over the n+ cathode region 120 and the p+ doped region 148. The contact may be formed in an interlayer dielectric (ILD) layer. Although not shown, the interlayer dielectric layer may be formed over a top surface of the silicon controlled rectifier 100. A metallization layer may be formed over the interlayer dielectric layer connecting the contact over the n+ cathode region 120 and the p+ doped region 148.

An n+ doped region 114 may be arranged in the second n-well 110. A silicide block layer 150 may be arranged over the p+ anode region 112 and the n+ doped region 114. The silicide block layer 150 prevents silicidation of the p+ anode region 112 and the n+ doped region 114 thereby increasing the ballast resistance of the silicon controlled rectifier 100 and improving its current handling capability. An isolation structure 116 may be arranged between the n+ doped region 114 and the p+ anode region 112. A line 140 may indicate an electrical connection between the p+ anode region 112 and the n+ doped region 114. Although not shown, a contact may be formed over the p+ anode region 112 and the n+ doped region 114. The contact may be formed in an interlayer dielectric (ILD) layer. A metallization layer may be formed over the interlayer dielectric layer connecting the contact over the p+ anode region 112 and the n+ doped region 114. In another embodiment, the isolation structure 116 may be an optional feature. In another embodiment, the n+ doped region 114 may be next to the p+ anode region 112.

An n+ doped region 132 may be arranged in the first n-well 106. The n+ doped region 132 may be a contact for the first n-well 106. A p+ doped region 124 may be arranged in the substrate 102. The p+ doped region 124 may be a contact for the substrate 102. An isolation structure 130 may be arranged between the p+ doped region 124 and the n+ doped region 132. An isolation structure 134 may be arranged between the n+ doped region 132 and the p+ doped region 148. The isolation structures 130 and 134 may be shallow trench isolation.

Figure 1B:
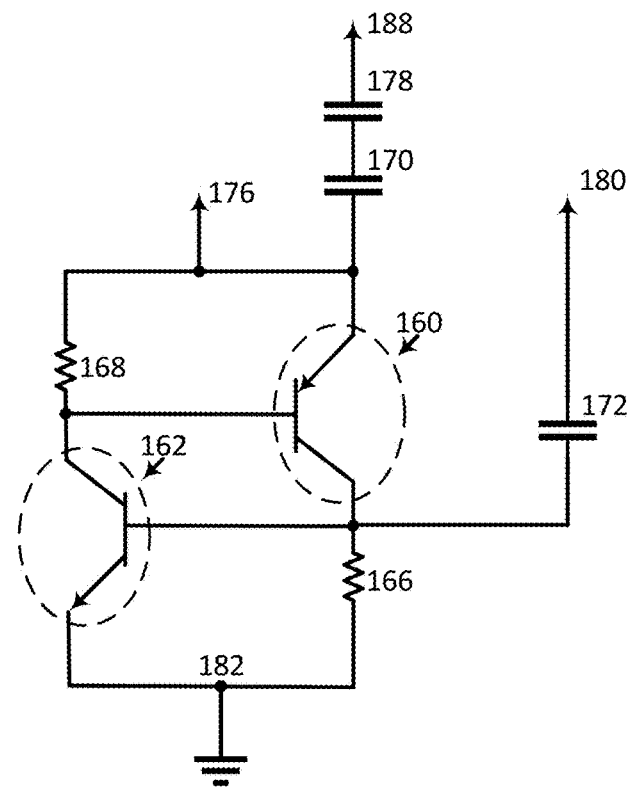
FIG. 1B is an equivalent circuit diagram of the silicon controlled rectifier illustrated in FIG. 1A, according to an embodiment of the disclosure.

FIG. 1B is an equivalent circuit diagram of the silicon controlled rectifier 100 illustrated in FIG. 1A, according to an embodiment of the disclosure. Referring to FIG. 1B, the circuit diagram shows a PNP transistor 160, an NPN transistor 162, resistors 166 and 168, capacitors 170, 172 and 178, an anode terminal 176, a cathode terminal 182, inputs 188 and 180. Referring to FIGS. 1A and 1B, the p+ anode region 112 may be an emitter of the PNP transistor 160, the first 106 and second 110 n-wells may be a base of the PNP transistor 160 and the first 108 and the second 118 p-wells may be a collector of the PNP transistor 160. The resistor 168 may represent a resistance of the first 106 and second 110 n-wells. The resistor 166 may represent a resistance of the first 108 and the second 118 p-wells. The first 106 and second 110 n-wells may be a collector of the NPN transistor 162, the first 108 and the second 118 p-wells may be a base of the NPN transistor 162 and the n+ cathode region 120 may be an emitter of the NPN transistor 162. Capacitor 178 may be a capacitance of the first gate dielectric 126 and the first gate electrode 128. Capacitor 170 may be a parasitic capacitance of the field oxide layer 122 and the first gate electrode 128. Input node 188 may be coupled to the first gate electrode 128. Capacitor 172 may be a capacitance of the second gate dielectric layer 136 and the second gate electrode 138. Input node 180 may be coupled to the second gate electrode 138 and another electrode of the capacitor 172 may be coupled to the base of the NPN transistor 162. The capacitors 170, 178 and 172 may provide separate and independent controls of the silicon controlled rectifier device. For example, the input node 188 may be floating or grounded. A positive bias to the input node 180 may increase the holding voltage of the silicon controlled rectifier device.

An electrostatic discharge event may be detected at the anode terminal 176. In one embodiment, the cathode terminal 182 may be grounded. As the voltage and current between the anode terminal 176 and the cathode terminal 182 increases, a trigger condition is eventually reached and the silicon controlled rectifier circuit is turned on. For further increases in the current across the anode 176 terminal, the voltage between the anode terminal 176 and the cathode terminal 182 is held relatively fixed by the silicon controlled rectifier device, thereby protecting other devices in the substrate. A return to a normal operating condition may deactivate the silicon controlled rectifier device.

Figure 2:
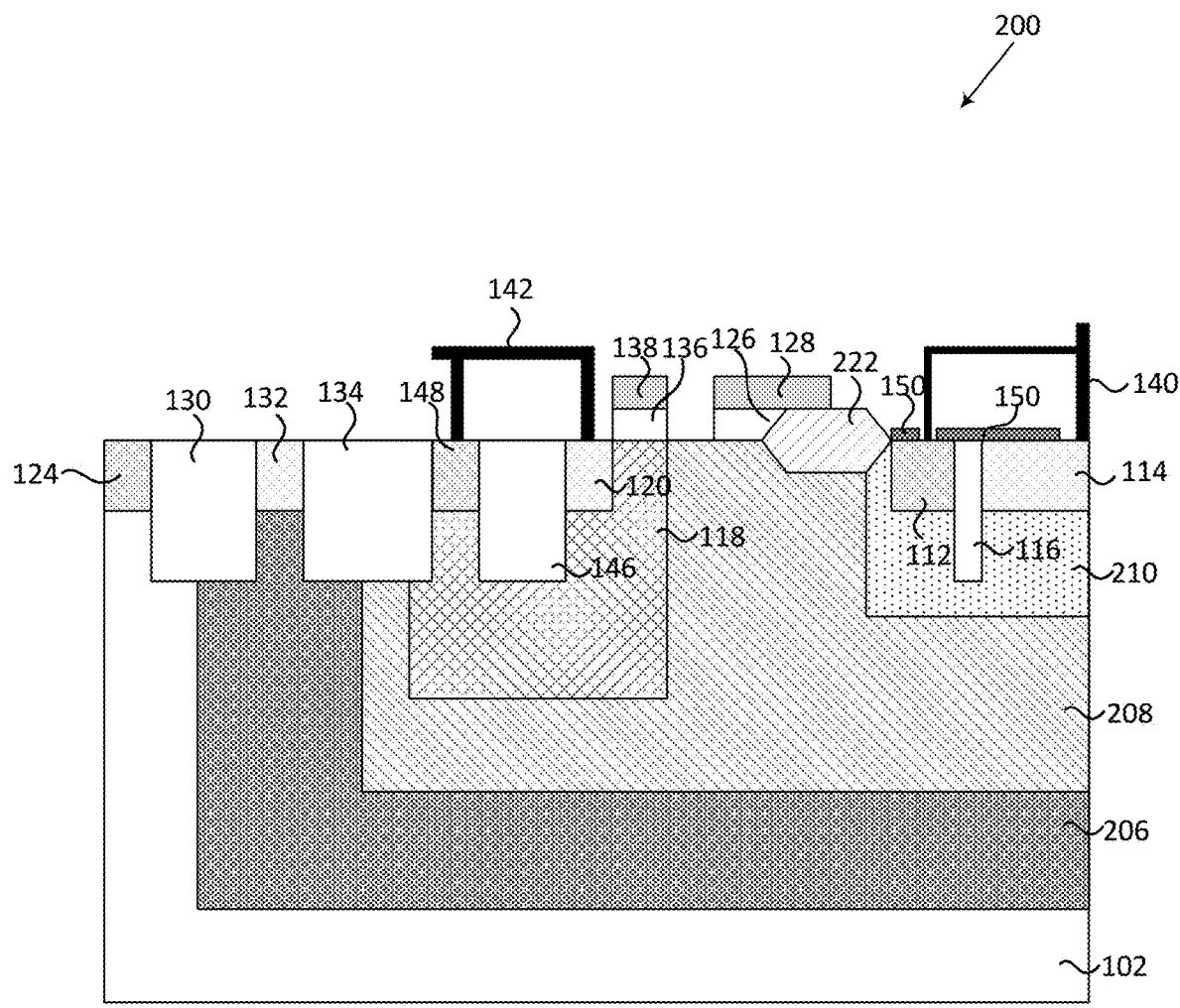
FIG. 2 is a cross-section view of a silicon controlled rectifier, according to another embodiment of the disclosure.

FIG. 2 is a cross-section view of a silicon controlled rectifier 200, according to another embodiment of the disclosure. Like reference numerals in FIG. 1A to represent like features in FIG. 2. Referring to FIG. 2, in contrast to the silicon controlled rectifier 100 shown in FIG. 1A, the silicon controlled rectifier 200 shows a first p-well 208 in a first n-well 206. A second n-well 210 may be arranged in the first p-well 208. A p+ anode region 112 may be in the second n-well 210. A portion of a field oxide layer 222 may be arranged over a portion of the second n-well 210 adjacent to the p+ anode region 112. A remaining portion of the field oxide layer 222 may be arranged over the first p-well 208. An n+ doped region 114, a silicide block layer 150, a first 128 and second 138 gate electrode layers, a first 126 and second 136 gate dielectric layers, a second p-well 118, an n+ cathode region 120, a p+ doped region 148, isolation structures 130, 134 146 and 116, and a substrate 102 are similar to FIG. 1A.

Figure 3:
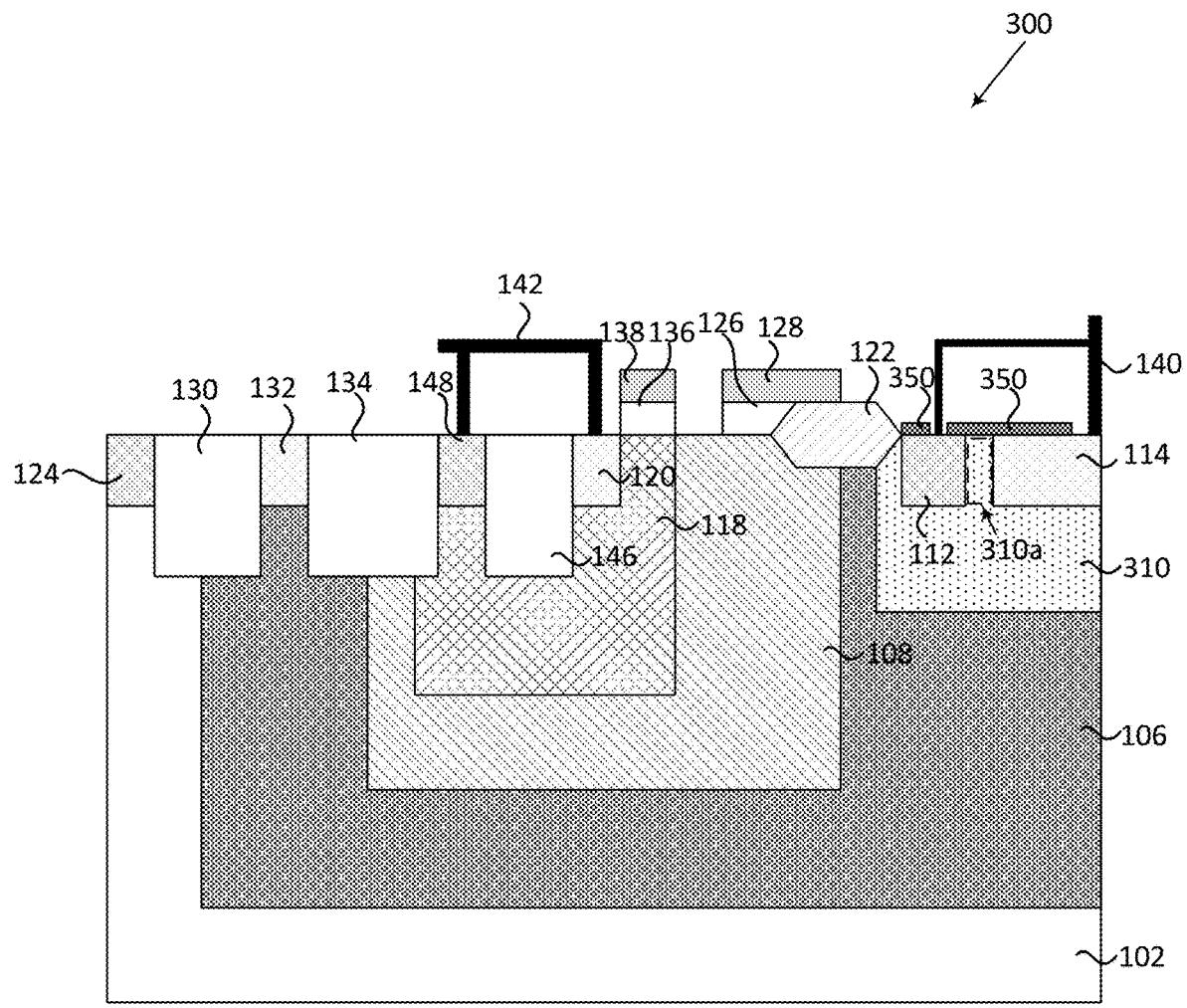
FIG. 3 is a cross-section view of a silicon controlled rectifier, according to another embodiment of the disclosure.

FIG. 3 is a cross-section view of a silicon controlled rectifier 300, according to another embodiment of the disclosure. Like reference numerals in FIG. 1A to represent like features in FIG. 3. Referring to FIG. 3, in contrast to the silicon controlled rectifier 100 shown in FIG. 1A, the silicon controlled rectifier 300 shows a portion 310a of a second n-well 310 may be arranged between an n+ doped region 114 and a p+ anode region 112. A silicide block layer 350 may be arranged over the n+ doped region 114, the p+ anode region 112 and the portion 310a of the second n-well 310 between the n+ doped region 114 and the p+ anode region 112. The second n-well 310 may be arranged in a first n-well 106. An on-resistance of the silicon controlled rectifier 300 may be reduced as compared to the silicon controlled rectifier 100, leading to improved performance. A first 128 and second 138 gate electrode layers, a first 126 and second 136 gate dielectric layers, a field oxide layer 122, a first n-well 106, a first p-well 108, a second p-well 118, an n+ cathode region 120, a p+ doped region 148, isolation structures 130, 134 and 146, and a substrate 102 are similar to FIG. 1A.

Figure 4:
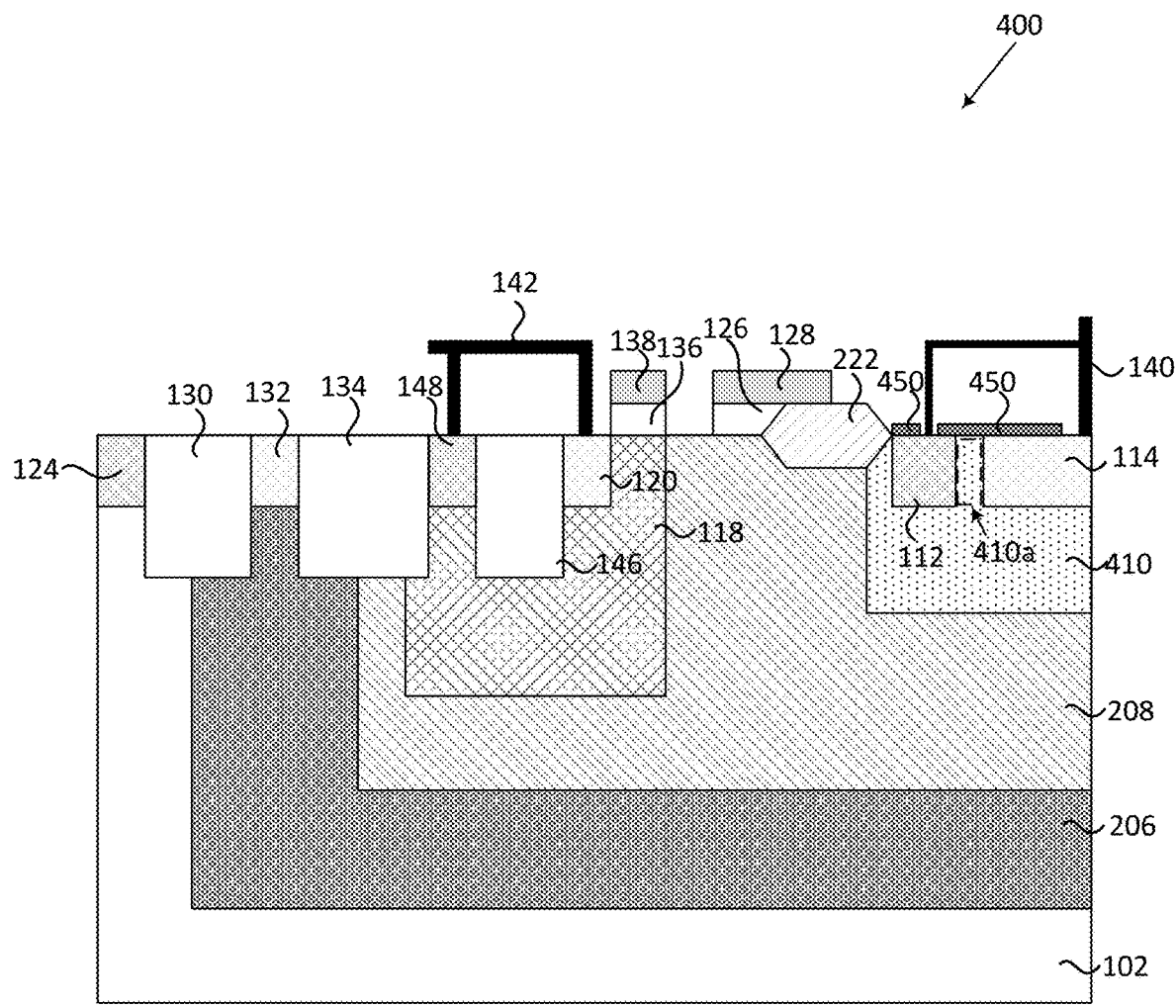
FIG. 4 is a cross-section view of a silicon controlled rectifier, according to another embodiment of the disclosure.

FIG. 4 is a cross-section view of a silicon controlled rectifier 400, according to another embodiment of the disclosure. Like reference numerals in FIG. 1A and FIG. 2 to represent like features in FIG. 4. Referring to FIG. 4, in contrast to the silicon controlled rectifier 200 shown in FIG. 2, the silicon controlled rectifier 400 shows a portion 410a of a second n-well 410 may be arranged between an n+ doped region 114 and a p+ anode region 112. A silicide block layer 450 may be arranged over the n+ doped region 114, the p+ anode region 112 and the portion 410a of the second n-well 410 between the n+ doped region 114 and the p+ anode region 112. The second n-well 410 may be arranged in a first p-well 208. Similar to the silicon controlled rectifier device 300 shown in FIG. 3, an on-resistance of the silicon controlled rectifier 400 may be reduced as compared to the silicon controlled rectifier 200, leading to improved performance. A first 128 and second 138 gate electrode layers, a first 126 and second 136 gate dielectric layers, a field oxide layer 222, a first n-well 206, the first p-well 208, a second p-well 118, an n+ cathode region 120, a p+ doped region 148, isolation structures 130, 134 and 146, and a substrate 102 are similar to FIG. 2.

Figure 5:
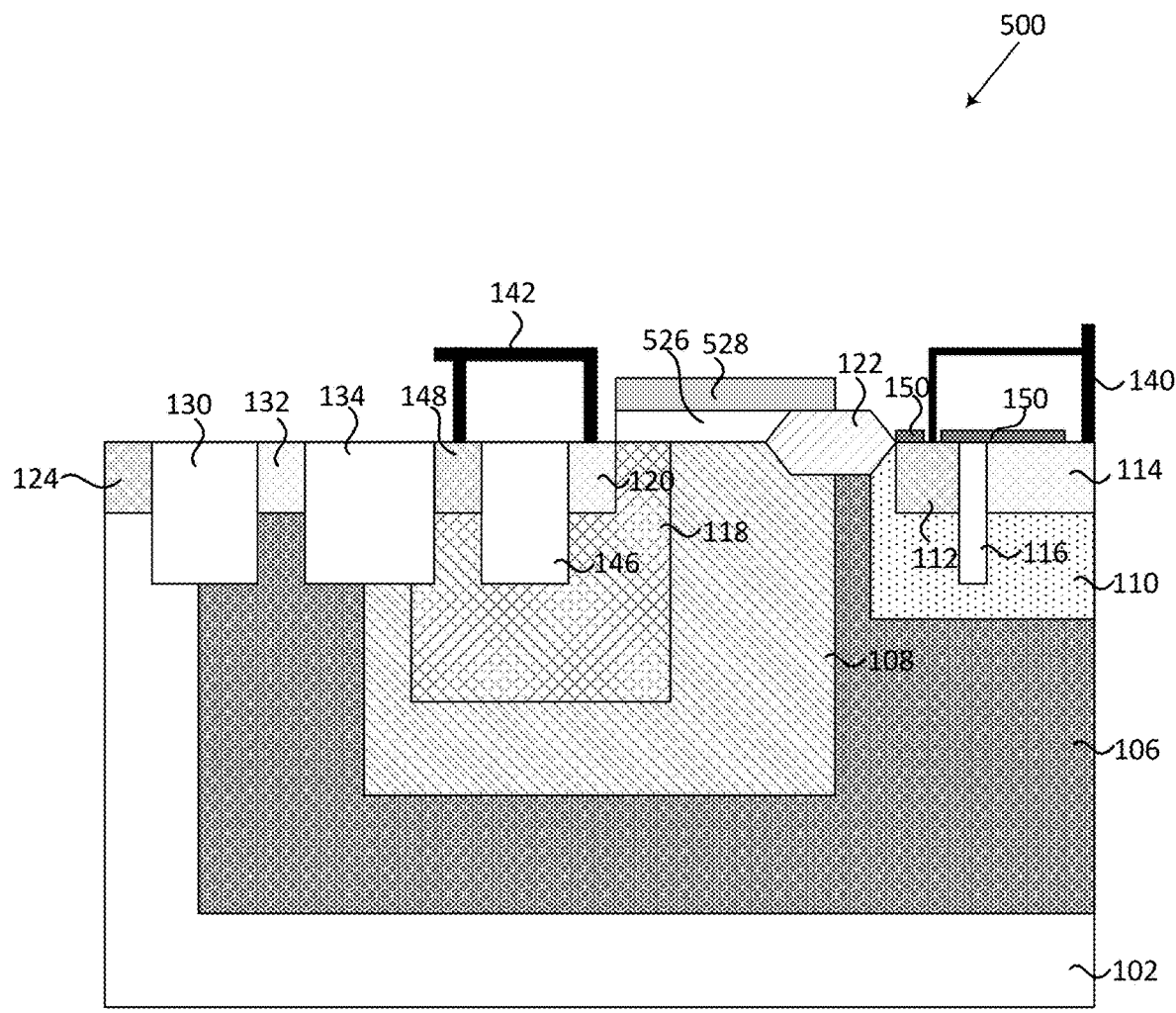
FIG. 5 is a cross-section view of a silicon controlled rectifier, according to another embodiment of the disclosure.

FIG. 5 is a cross-section view of a silicon controlled rectifier 500, according to another embodiment of the disclosure. Like reference numerals in FIG. 1A to represent like features in FIG. 5. Referring to FIG. 5, in contrast to the silicon controlled rectifier 100 illustrated in FIG. 1A, the silicon controlled rectifier 500 shows a first gate electrode layer 528 extending over a portion of a field oxide layer 122, a portion of a first p-well 108 and a portion of a second p-well 118 adjacent to an n+ cathode region 120. A first gate dielectric layer 526 may be arranged between the first gate electrode layer 528 and a portion of the first p-well 108 and a portion of a second p-well 118. A first n-well 106, a second n-well 110, isolation structures 116, 130, 134 and 146, a p+ anode region 112, an n+ doped region 114, a p+ doped region 148 and a substrate 102 are similar to FIG. 1A.

Figure 6A:
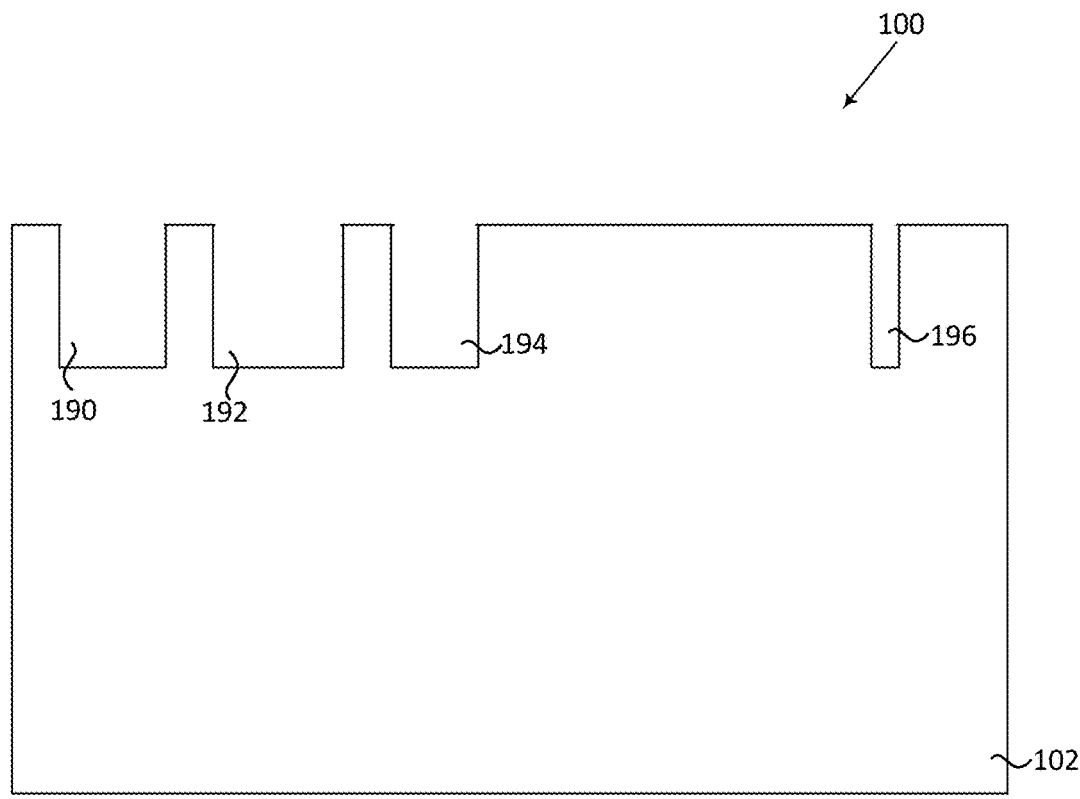
FIGS. 6A to 6F illustrate a fabrication process flow of a silicon controlled rectifier as shown in FIG. 1A, according to some embodiments of the disclosure.

FIGS. 6A to 6F illustrate a fabrication process flow of a silicon controlled rectifier 100 as shown in FIG. 1A, according to some embodiments of the disclosure. FIG. 6A shows a partially completed silicon controlled rectifier 100 after formation of openings 190, 192, 194 and 196 in a substrate 102. Referring to FIG. 6A, a substrate 102 may be provided. In an embodiment, the substrate 102 may be p-doped silicon. Openings 190, 192, 194 and 196 may be formed in the substrate 102. The formation of the openings 190, 192, 194 and 196 may include patterning by a conventional photolithography process followed by a wet or dry etch. The conventional photolithography process may include deposition of a suitable photoresist layer over a top surface of the substrate 102 followed by exposure and developing to form a suitable photoresist pattern. A wet or dry etch process may be used to remove a portion of the substrate 102 not covered by the photoresist pattern thereby forming the openings 190, 192, 194 and 196.

Figure 6B:
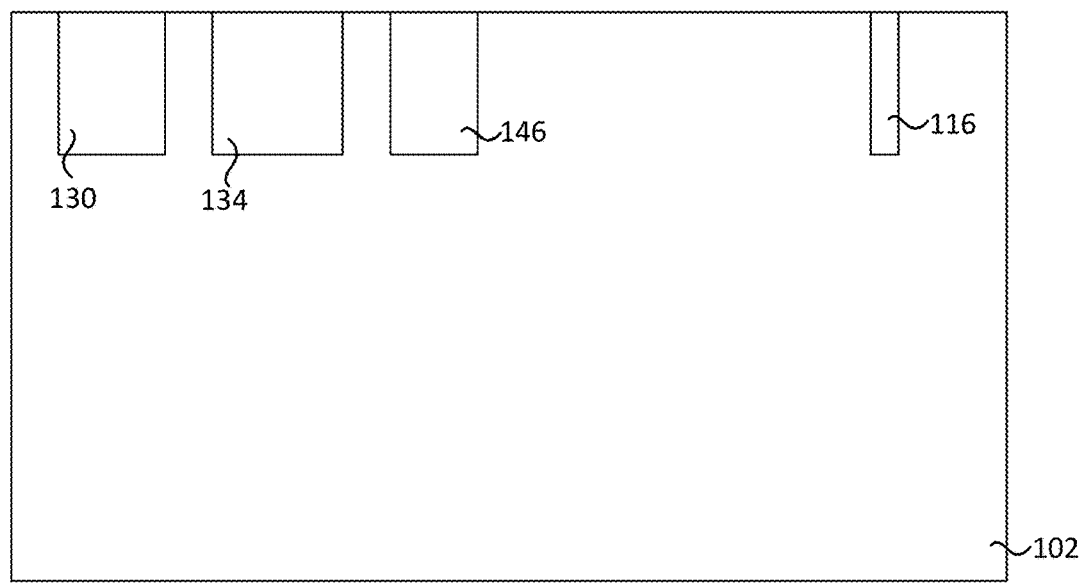

FIG. 6B shows a partially completed silicon controlled rectifier 100 after formation of isolation structures 130, 134, 146 and 116, according to an embodiment of the disclosure. Referring to FIG. 6B, a layer of suitable dielectric material, for example silicon dioxide ($SiO_2$), may be deposited in the openings 190, 192, 194 and 196 in the substrate 102. The deposition process may be by atomic layer deposition (ALD), chemical vapor deposition (CVD), physical vapor deposition (PVD) or any other suitable deposition processes. A suitable planarization process, for example chemical mechanical planarization (CMP), may be used to remove a portion of the silicon dioxide layer from a top surface of the substrate 102 leaving behind another portion of the silicon dioxide layer in the openings 190, 192, 194 and 196 thereby forming the isolation structures 130, 134 146 and 116, respectively.

Figure 6C:
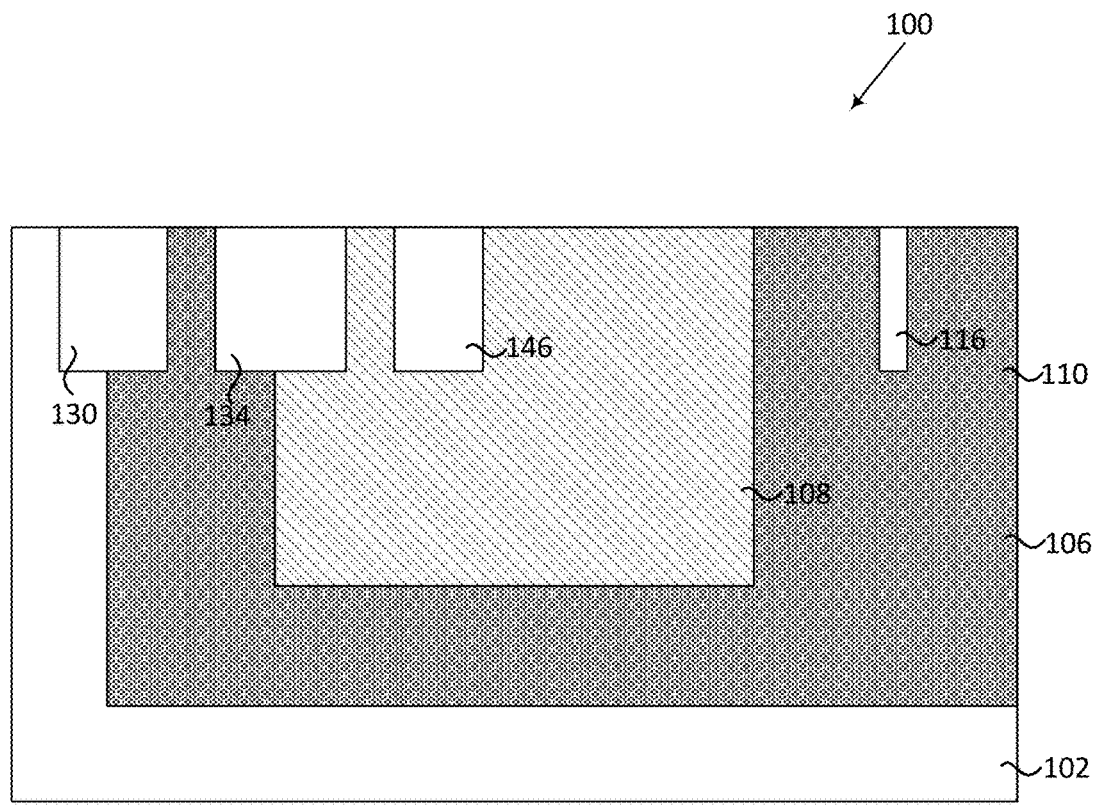

FIG. 6C shows a partially completed silicon controlled rectifier 100 after formation of a first n-well 106 and a first p-well 108, according to an embodiment of the disclosure. Referring to FIG. 6C, the formation of the first n-well 106 may include implanting a suitable dopant, for example phosphorus (P), arsenic (As), or any other suitable dopant followed by activation annealing. An implantation mask may be used during the implantation process. For simplicity, the implantation mask is not shown in FIG. 6C. The formation of the first p-well 108 may include implanting a suitable dopant, for example boron (B), or any other suitable dopant followed by activation annealing. The first p-well 108 may be formed in the first n-well 106.

Figure 6D:
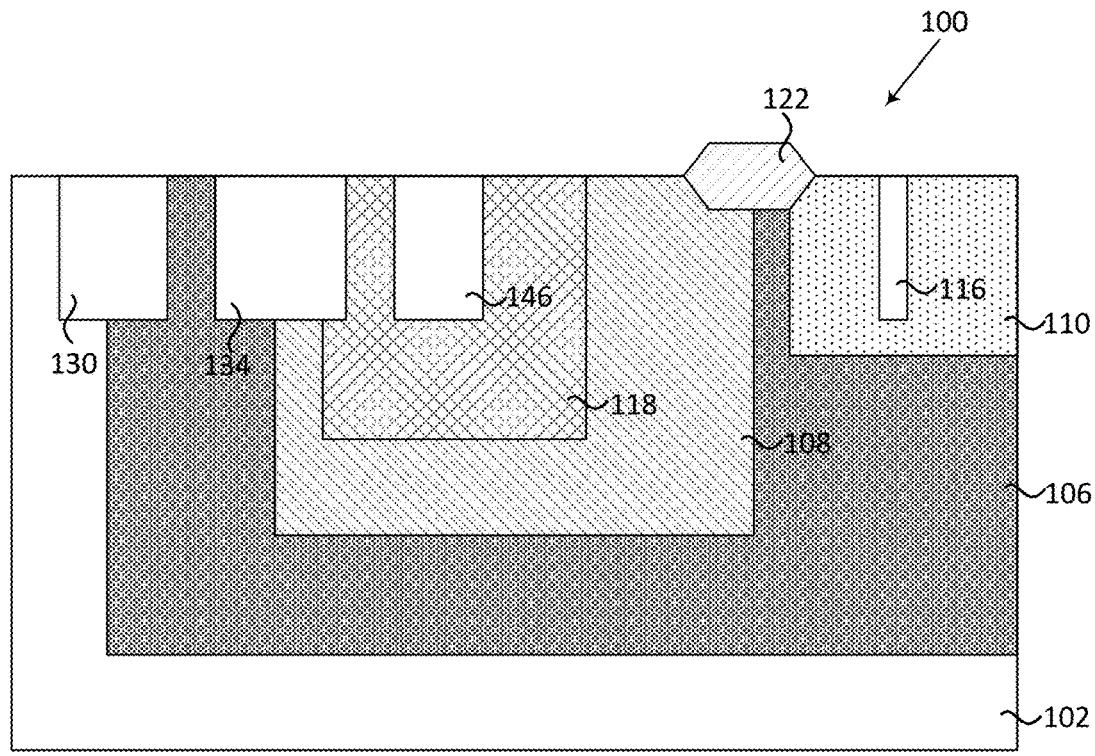

FIG. 6D shows a partially completed silicon controlled rectifier 100 after formation of a field oxide layer 122, a second p-well 118 and a second n-well 110, according to an embodiment of the disclosure. The formation of a field oxide layer 122 may include forming a sacrificial layer of silicon dioxide over a top surface of the silicon controlled rectifier 100. A sacrificial layer of silicon nitride may be formed over the silicon dioxide layer. For simplicity, the sacrificial layer of silicon dioxide and silicon nitride are not shown in FIG. 6D. The sacrificial layer of silicon nitride may be patterned by a conventional photolithography process and a wet or dry etch to remove a portion of the sacrificial silicon nitride from a portion of the sacrificial silicon dioxide layer over a portion of the top surface of the first p-well 108 and the first n-well 106. A thermal oxidation process may be used to oxidize the portion of the top surface of the first p-well 108 and the first n-well 106 to form a thick silicon dioxide layer thereby forming the field oxide layer 122. The sacrificial layer of silicon dioxide and silicon nitride may subsequently be removed. A second n-well 110 may be formed in the first n-well 106 adjacent to a portion of the field oxide layer 122. The formation of the second n-well 110 may include implanting a suitable dopant, for example phosphorus (P), arsenic (As), or any other suitable dopant followed by activation annealing. The second n-well 110 may be formed in the first n-well 106 and next to the first p-well 108. A second p-well 118 may be formed in the first p-well 108 and surrounding the isolation structure 146. The formation of the second p-well 118 may include implanting a suitable dopant, for example boron (B), or any other suitable dopant followed by activation annealing.

Figure 6E:
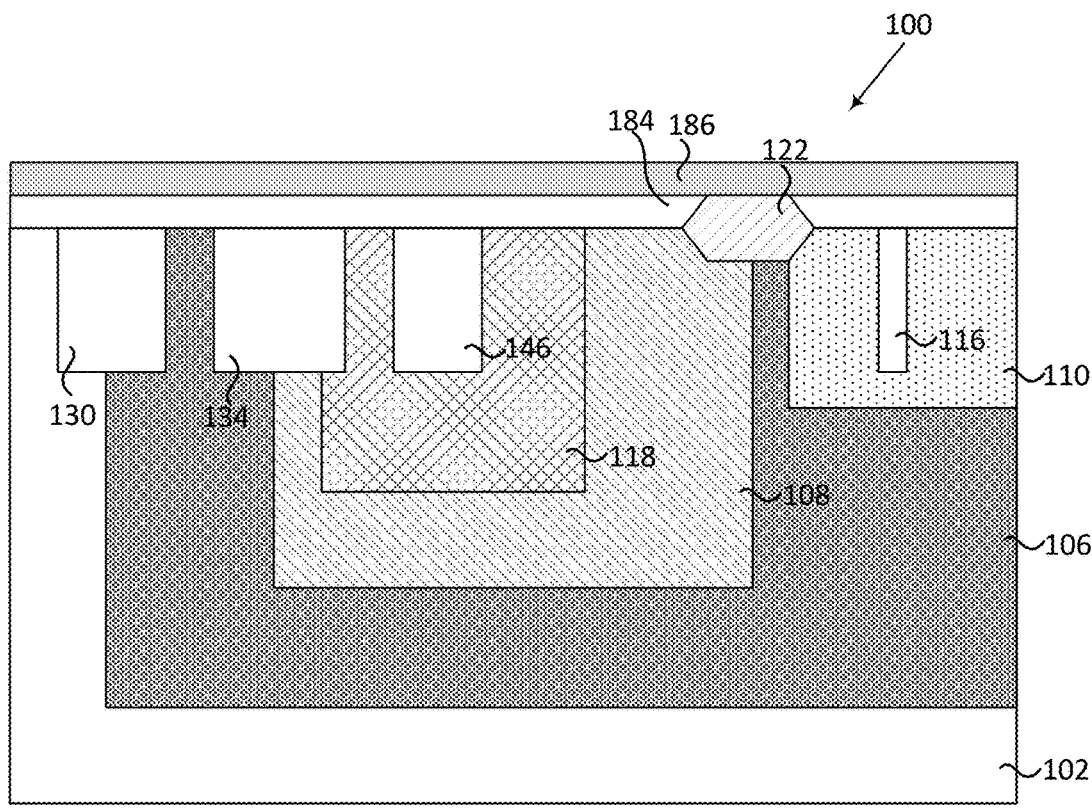

FIG. 6E shows a partially completed silicon controlled rectifier 100 after formation of a layer of gate dielectric material 184 and gate electrode material layer 186, according to an embodiment of the disclosure. Referring to FIG. 6E, the formation of the gate dielectric material layer 184 may include deposition of a suitable dielectric material, for example silicon dioxide or any other suitable dielectric material over a top surface of the substrate 102, a portion of the first n-well 106, a portion of the first p-well 108, the second p-well 118, the second n-well 110 and the isolation structures 130, 134, 146 and 116. A gate electrode material layer 186 may be deposited over the gate dielectric material layer 184 and the field oxide layer 122. In an embodiment, the gate electrode material layer 186 may be n-doped polysilicon. The deposition processes may be by atomic layer deposition (ALD), chemical vapor deposition (CVD), physical vapor deposition (PVD) or any other suitable deposition processes.

Figure 6F:
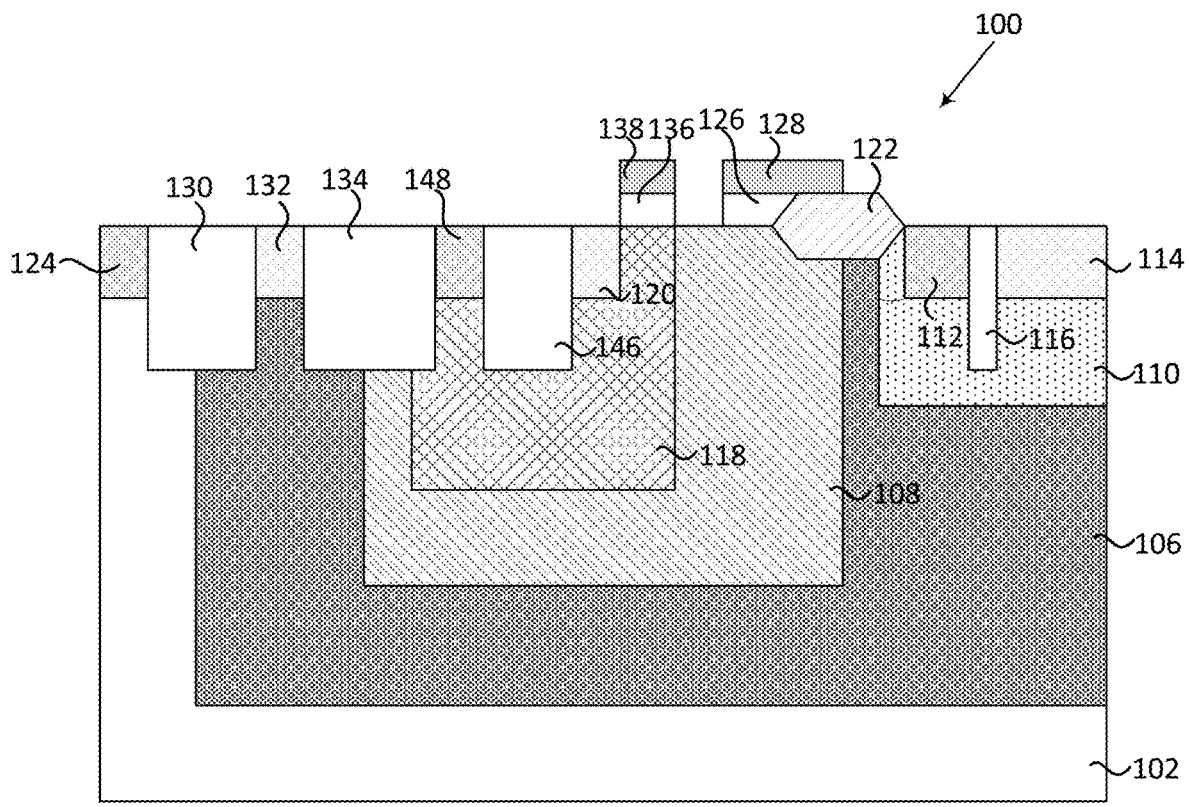

FIG. 6F shows a partially completed silicon controlled rectifier 100 after formation of a first 126 and second 136 gate dielectric layers and a first 128 and second 138 gate electrode layers, a p+ anode region 112, n+ doped regions 114 and 132, an n+ cathode region 120, p+ doped regions 124 and 148, according to an embodiment of the disclosure. Referring to FIG. 6F, the formation of the first 126 and second 136 gate dielectric layers and the first 128 and second 138 gate electrode layers may include patterning the gate dielectric material layer 184 and the gate electrode material layer 186 by a conventional photolithography process followed by a wet or dry etch. The patterning process may leave behind a portion of the gate dielectric material layer 184 over a portion of the first p-well 108 adjacent to the field oxide layer 122 thereby forming the first gate dielectric layer 126. The patterning process may also leave behind a portion of the gate electrode material layer 186 over the first gate dielectric layer 126 and a portion of the field oxide layer 122 to thereby form the first gate electrode layer 128. The patterning process may also leave behind another portion of the gate dielectric material layer 184 and the gate electrode material layer 186 over a portion of the second p-well 118 thereby forming the second gate dielectric layer 136 and the second gate electrode layer 138, respectively. Although not shown, spacer structures may be formed on sidewalls of the first 128 and second 138 gate electrode layers. A p+ anode region 112 and p+ doped regions 124 and 148 may be formed in the second n-well 110, the substrate 102 and the second p-well 118, respectively. The formation of the p+ anode region 112 and p+ doped regions 124 and 148 may include doping a portion of the second n-well 110, the substrate 102 and the second p-well 118, respectively, by implanting a suitable dopant, for example boron or any other suitable dopant, followed by activation annealing. Although not shown, an implantation mask may be used for the implantation process. An n+ cathode region 120 and n+ doped regions 114 and 132 may be formed by doping a portion of the second p-well 118 adjacent to the second gate electrode 138, the second n-well 110 and the first n-well 106, respectively, by implanting with a suitable dopant, for example phosphorus, arsenic or any other suitable dopant followed by activation annealing. The activation annealing after the implantation processes may be done at the same time.

The process continues to form the structure of FIG. 1A, where a silicide block layer 150 may be formed over the p+ anode region 112, the isolation structure 116 and a portion of the n+ doped region 114. The formation of the silicide block layer 150 may include depositing a layer of suitable dielectric material, for example silicon dioxide or any other suitable dielectric over a top surface of the p+ anode region 112, the isolation structure 116 and the n+ doped region 114. The deposition process may be by atomic layer deposition, chemical vapor deposition, physical vapor deposition or any other suitable deposition processes. The silicon dioxide layer may be patterned by a conventional photolithography process followed by a wet or dry etch process to leave behind a portion of the silicon dioxide layer over the p+ anode region 112, the isolation structure 116 and a portion of the n+ doped region 114 to thereby form the silicide block layer 150. Although not shown, an interlayer dielectric layer may be deposited over a top surface of the silicon controlled rectifier 100. A contact may be formed over the p+ anode region 112 and the n+ doped region 114, the n+ cathode region 120 and the p+ doped region 148. The formation of the contact may include forming an opening in the interlayer dielectric layer by a conventional photolithography process followed by a wet or dry etch. A suitable conductive material, for example tungsten (W) or any other suitable conductive material may be deposited in the opening by atomic layer deposition, chemical vapor deposition, physical vapor deposition or any other suitable deposition processes. A suitable planarization process, for example chemical mechanical planarization, may be used to remove the tungsten layer from a top surface of the interlayer dielectric layer leaving behind another portion of the tungsten layer in the opening thereby forming the contact over the p+ anode region 112 and the n+ doped region 114, the n+ cathode region 120 and the p+ doped region 148. A metallization layer may be formed over the interlayer dielectric layer connecting the contact over the p+ anode region 112 and the n+ doped region 114. A metallization layer may also be formed over the interlayer dielectric layer connecting the contact over the n+ cathode region 120 and the p+ doped region 148. The formation of the metallization layer may include depositing a layer of photoresist followed by patterning the photoresist layer by a conventional photolithography process to form openings to expose a top surface of the contact over the p+ anode region 112 and the n+ doped region 114, the n+ cathode region 120 and the p+ doped region 148 and a portion of the interlayer dielectric layer between the p+ anode region 112 and the n+ doped region 114 and between the n+ cathode region 120 and the p+ doped region 148. A layer of suitable conductive material, for example copper (Cu) or any other suitable conductive material may be deposited in the opening in the photoresist layer by electroplating, chemical vapor deposition or physical vapor deposition or any other suitable deposition processes. The photoresist layer may be removed in a conventional lift-off process to leave behind a portion of the copper layer over the contact to thereby form the metallization layer connecting the contact over the n+ cathode region 120 and the p+ doped region 148 and connecting the contact over the p+ anode region 112 and the n+ doped region 114.

Figure 7A:
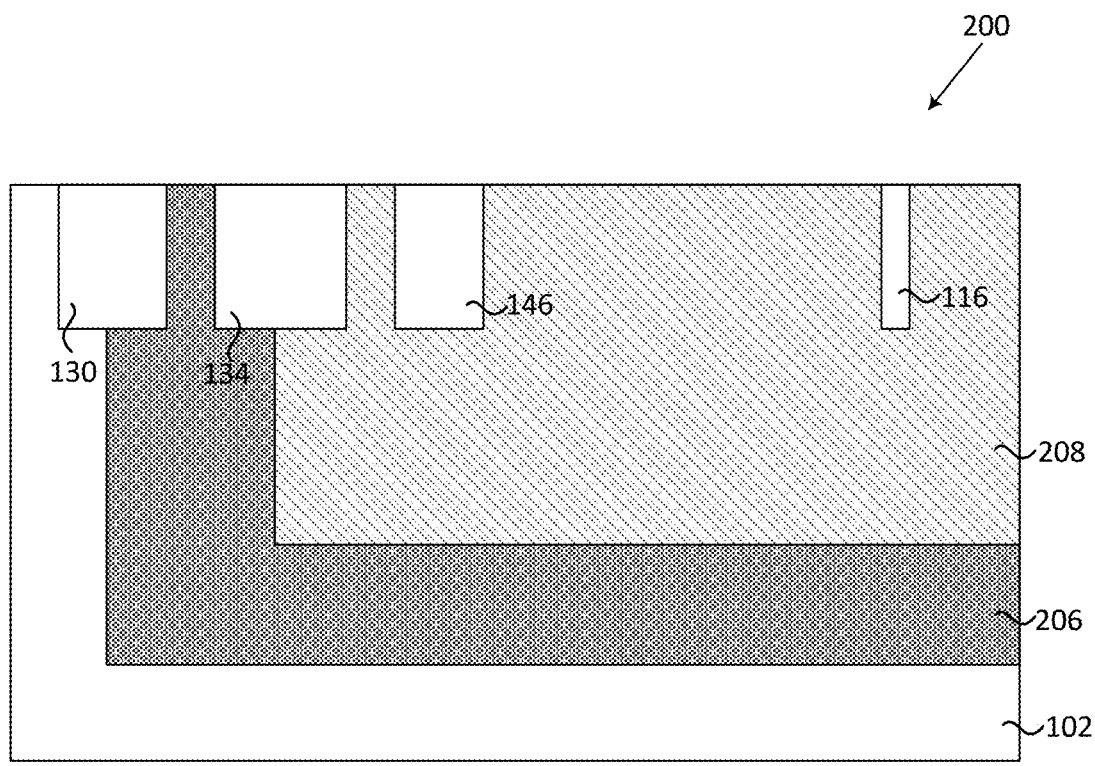
FIGS. 7A and 7B show a fabrication process flow of a silicon controlled rectifier as shown in FIG. 2, according to some embodiments of the disclosure.
Figure 7B:
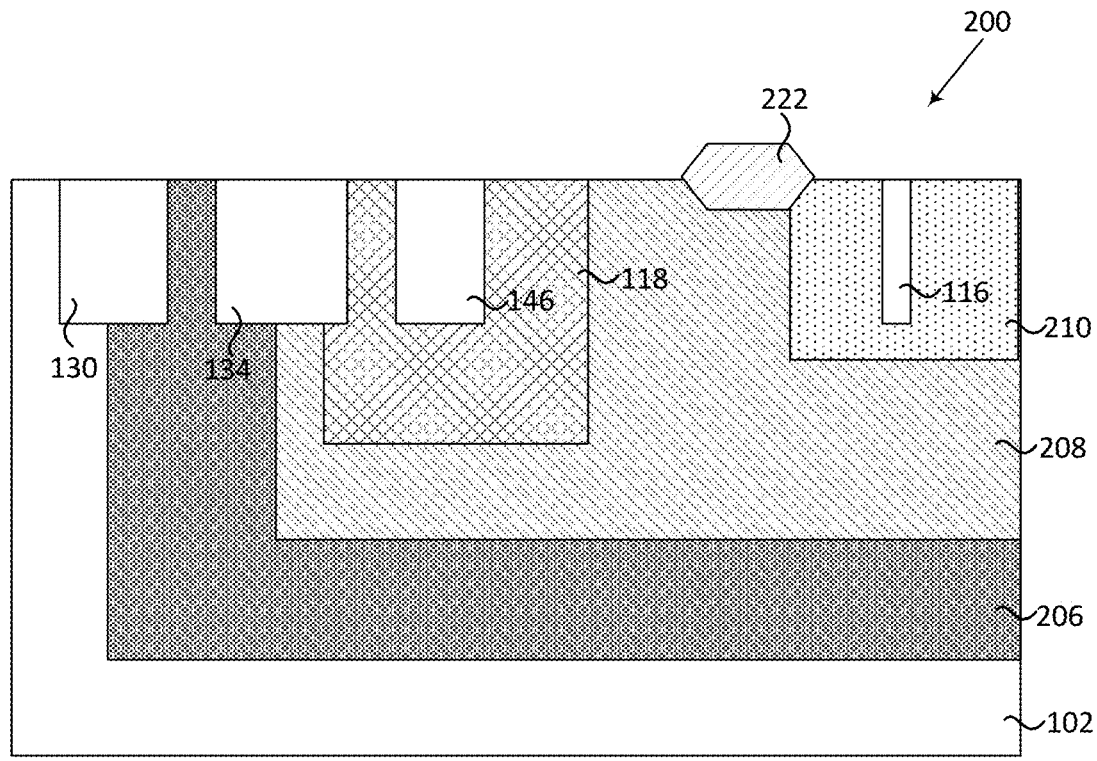

FIGS. 7A and 7B show a fabrication process flow of a silicon controlled rectifier 200 as shown in FIG. 2, according to some embodiments of the disclosure. FIG. 7A shows a partially completed silicon controlled rectifier 200 after formation of isolation structures 130, 134, 146, 116, a first n-well 206 and a first p-well 208, according to another embodiment of the disclosure. The isolation structures 130, 134, 146, 116 may be formed in a substrate 102. The formation of the isolation structures 130, 134, 146, 116 is similar to the fabrication process shown in FIGS. 6A and 6B. A first n-well 206 may be formed in the substrate 102. The formation of the first n-well 206 shown in FIG. 7 is similar to the fabrication process of the first n-well 106 shown in FIG. 6C. Referring to FIG. 7A, a first p-well 208 may be formed in the first n-well 206. The formation of the first p-well 208 may include doping a portion of the first n-well 206 by implanting a suitable dopant, for example boron or any other suitable dopant followed by activation annealing to thereby form the first p-well 208.

FIG. 7B shows a partially completed silicon controlled rectifier 200 after formation of a field oxide layer 222, a second n-well 210 and a second p-well 118, according to an embodiment of the disclosure. Similar to the fabrication process of the field oxide layer 122 shown in FIG. 6D, the formation of the field oxide layer 222 may include forming a layer of sacrificial silicon dioxide over the silicon controlled rectifier 200 and sacrificial silicon nitride over the silicon dioxide layer. For simplicity, the sacrificial silicon dioxide and silicon nitride layers are not shown in FIG. 7B. The sacrificial silicon nitride layer may be patterned by a conventional photolithography process followed by a wet or dry etch to expose a portion of the silicon dioxide layer over a portion of the first p-well 208. A thermal oxidation process may be used to oxidize a top surface of the portion of the first p-well 208 not covered by the sacrificial silicon nitride layer to form a thick silicon dioxide layer thereby forming the field oxide layer 222. The sacrificial silicon dioxide and silicon nitride layers may subsequently be removed. A second p-well 118 may be formed in the first p-well 208. The formation of the second p-well 118 is similar to the fabrication process of the second p-well 118 shown in FIG. 6D. A second n-well 210 may be formed in the first p-well 208 and adjacent to the field oxide layer 222. The formation of the second n-well 210 may include doping a portion of first p-well 208 by implanting a suitable dopant, for example phosphorus, arsenic or any other suitable dopant followed by activation annealing to thereby form the second n-well 210.

The process continues to form the structure in FIG. 2, where a first gate dielectric layer 126 and a first gate electrode layer 128 may be formed over a portion of the first p-well 208 and the field oxide layer 222. A second gate dielectric layer 136 and a second gate electrode layer 138 may be formed over a portion of the second p-well 118. The formation of the first 126 and second 136 gate dielectric layers, the first 128 and second 138 gate electrode layers is similar to the fabrication process shown in FIGS. 6E and 6F. A p+ anode region 112 may be formed in the second n-well 210. A p+ doped region 148 may be formed in the second p-well 118. A p+ doped region 124 may be formed in the substrate 102. An n+ doped region 132 may be formed in the first n-well 206. An n+ doped region 114 may be formed in the second n-well 210. An n+ cathode region 120 may be formed in the second p-well 118. The formation of the p+ anode region 112, n+ doped regions 114 and 132, n+ cathode region 120 and p+ doped regions 124 and 148 is similar to the fabrication process shown in FIG. 6F. A silicide block layer 150 may be formed over the p+ anode region 112 and the n+ doped region 114. The formation of the silicide block layer 150 is similar to the formation of the silicide block layer 150 shown in FIG. 1A.

Figure 8A:
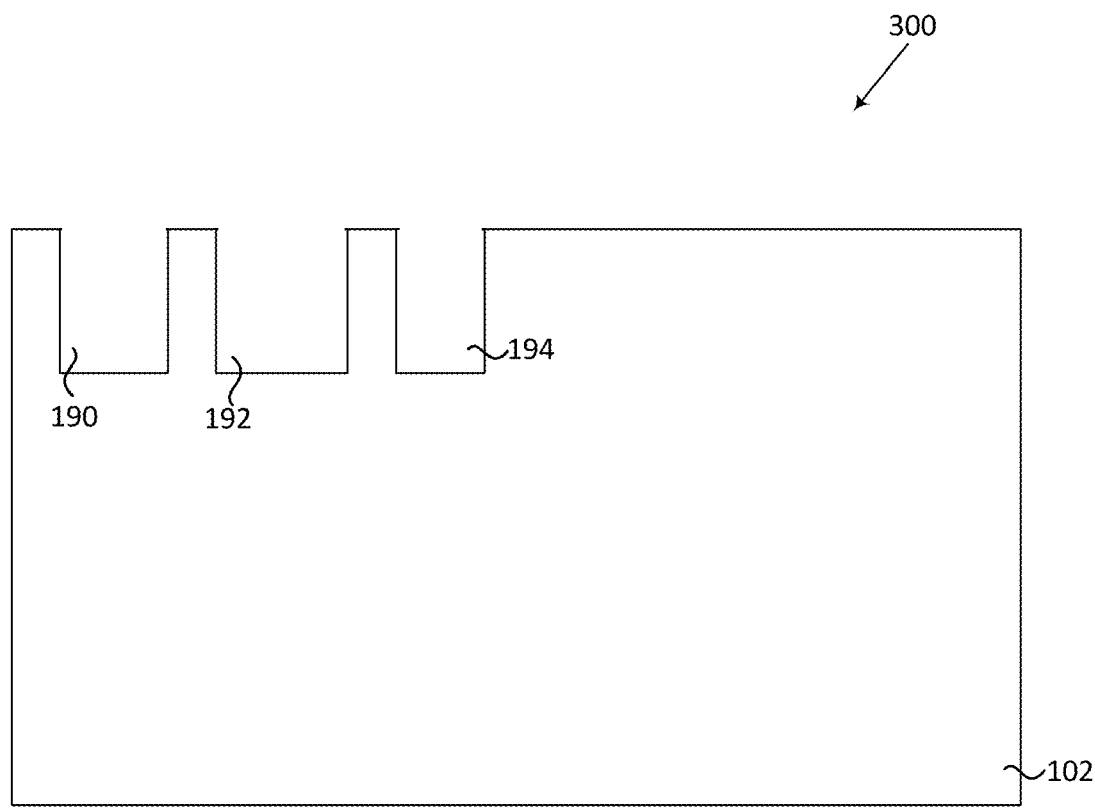
FIGS. 8A and 8B show a fabrication process flow to form isolation structures of a silicon controlled rectifier as shown in FIG. 3, according to some embodiments of the disclosure.
Figure 8B:
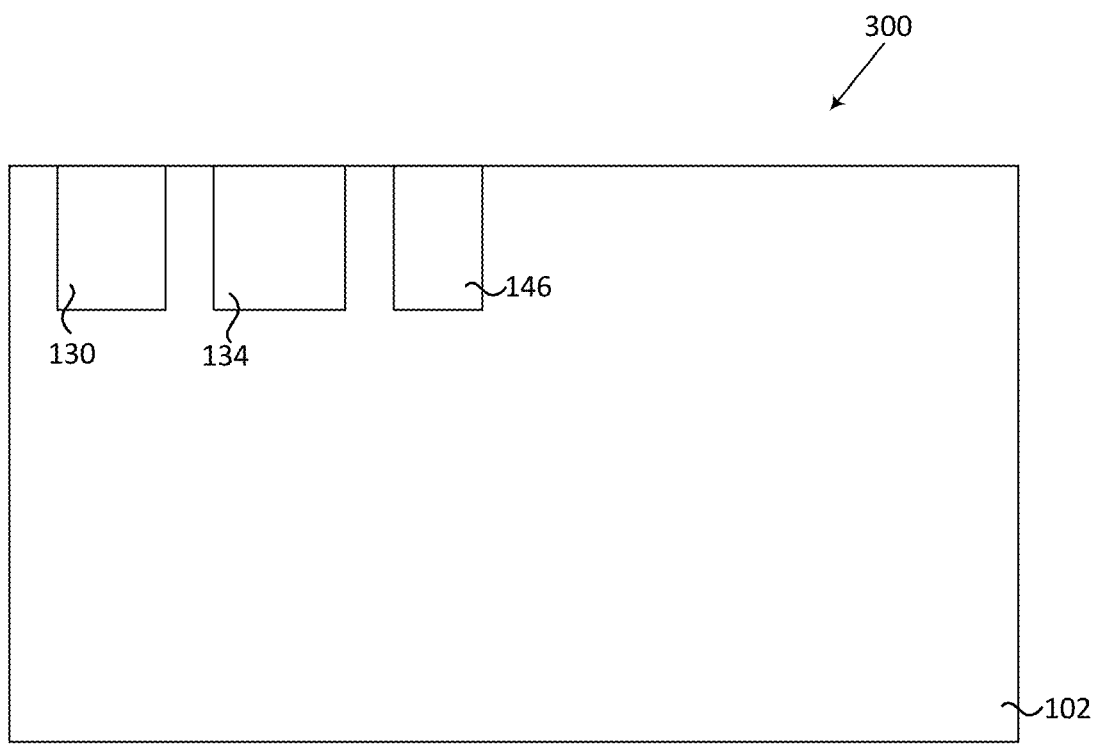

FIGS. 8A and 8B show a fabrication process flow of a silicon controlled rectifier 300 as shown in FIG. 3, according to some embodiments of the disclosure. FIG. 8A shows a partially completed silicon controlled rectifier 300 after formation of openings 190, 192, and 194 in a substrate 102, according to an embodiment of the disclosure. The formation of the openings 190, 192, and 194 is similar to the fabrication process of the openings 190, 192 and 194 shown in FIG. 6A.

FIG. 8B shows a partially completed silicon controlled rectifier 300 after formation of isolation structures 130, 134 and 146 in the substrate 102, according to an embodiment of the disclosure. The formation of the isolation structures 130, 134 and 146 is similar to the fabrication process of the isolation structures 130, 134 and 146 shown in FIG. 6B.

The process continues to form the structure in FIG. 3, where a first n-well 106 may be formed in the substrate 102 and a first p-well 108 may be formed in the first n-well 106. A field oxide layer 122 may be formed over a portion of the first p-well 108 and the first n-well 106. A second n-well 310 may be formed in the first n-well 106 and adjacent to the field oxide layer 122. The formation of the first n-well 106 and the first p-well 108 is similar to the fabrication process shown in FIG. 6C. The formation of the field oxide layer 122 is similar to the fabrication process shown in FIG. 6D. The formation of the second n-well 310 is similar to the fabrication process of the second n-well 110 shown in FIG. 6D. A second p-well 118 may be formed in the first p-well 108. The formation of the second p-well 118 is similar to the fabrication process shown in FIG. 6D. A first gate dielectric layer 126 and a first gate electrode layer 128 may be formed over a portion of the first p-well 108 and the field oxide layer 122. A second gate dielectric layer 136 and a second gate electrode layer 138 may be formed over a portion of the second p-well 118. The formation of the first 126 and second 136 gate dielectric layers and the first 128 and second 138 gate electrode layers is similar to the fabrication process shown in FIGS. 6E and 6F. A p+ anode region 112 may be formed in the second n-well 310. A p+ doped region 148 may be formed in the second p-well 118. A p+ doped region 124 may be formed in the substrate 102. An n+ doped region 132 may be formed in the first n-well 106. An n+ doped region 114 may be formed in the second n-well 310. An n+ cathode region 120 may be formed in the second p-well 118. The formation of the p+ anode region 112, n+ doped regions 114 and 132, n+ cathode region 120, p+ doped regions 124 and 148 is similar to the fabrication process shown in FIG. 6F. A silicide block layer 350 may be formed over the p+ anode region 112, the n+ doped region 114 and a portion of the second n-well 310 between the p+ anode region 112 and the n+ doped region 114. The formation of the silicide block layer 350 may include depositing a layer of suitable dielectric material, for example silicon dioxide or any other suitable dielectric over a top surface of the p+ anode region 112, the n+ doped region 114 and the portion of the second n-well 310 between the p+ anode region 112 and the n+ doped region 114. The silicon dioxide layer may be patterned by a conventional photolithography process followed by a wet or dry etch to leave behind a portion of the silicon dioxide layer over the p+ anode region 112, the n+ doped region 114 and the portion of the second n-well 310 between the p+ anode region 112 and the n+ doped region 114, thereby forming the silicide block layer 350.

Referring now to FIG. 4, isolation structures 130, 134 and 146 may be formed in a substrate 102. The formation of isolation structures 130, 134 and 146 of the silicon controlled rectifier 400 is similar to the fabrication process shown in FIGS. 8A and 8B. A first n-well 206 may be formed in the substrate 102 and a first p-well 208 may be formed in the first n-well 206. The formation of the first n-well 206 and the first p-well 208 is similar to the fabrication process shown in FIG. 7A. A field oxide layer 222 may be formed over a portion of the first p-well 208. The formation of the field oxide layer 222 is similar to the fabrication process shown in FIG. 7B. A second n-well 410 may be formed in the first p-well 208. The formation of the second n-well 410 is similar to the formation of the second n-well 210 shown in FIG. 7B. A second p-well 118 may be formed in the first p-well 208. The formation of the second p-well 118 is similar to the fabrication process shown in FIG. 7B. A p+ anode region 112 may be formed in the second n-well 410. A p+ doped region 148 may be formed in the second p-well 118. A p+ doped region 124 may be formed in the substrate 102. An n+ doped region 132 may be formed in the first n-well 206. An n+ doped region 114 may be formed in the second n-well 410. An n+ cathode region 120 may be formed in the second p-well 118. The formation of the p+ anode region 112, n+ doped regions 114 and 132, n+ cathode region 120, p+ doped regions 124 and 148 is similar to the fabrication process shown in FIG. 6F. A silicide block layer 450 may be formed over the p+ anode region 112, the n+ doped region 114 and a portion of the second n-well 410 between the p+ anode region 112 and the n+ doped region 114. The formation of the silicide block layer 450 may include depositing a layer of suitable dielectric material, for example silicon dioxide or any other suitable dielectric material over a top surface of the p+ anode region 112, the n+ doped region 114 and the portion of the second n-well 410 between the p+ anode region 112 and the n+ doped region 114. The silicon dioxide layer may be patterned by a conventional photolithography process followed by a wet or dry etch to leave behind a portion of the silicon dioxide layer over the p+ anode region 112, the n+ doped region 114 and the portion of the second n-well 410 between the p+ anode region 112 and the n+ doped region 114, thereby forming the silicide block layer 450.

Referring back to FIG. 5, isolation structures 130, 134, 146 and 116 may be formed in a substrate 102. The formation of the isolation structures 130, 134, 146 and 116 is similar to the fabrication process shown in FIGS. 6A and 6B. A first n-well 106 may be formed in the substrate 102 and a first p-well 108 may be formed in the first n-well 106. The formation of the first n-well 106 and the first p-well 108 is similar to the fabrication process shown in FIG. 6C. A field oxide layer 122 may be formed over a portion of the first n-well 106 and the first p-well 108. A second n-well 110 may be formed in the first n-well 106 and adjacent to the field oxide layer 122 . . . . A second p-well 118 may be formed in the first p-well 108. The formation of the field oxide layer 122, the second n-well 110 and the second p-well 118 is similar to the fabrication process shown in FIG. 6D. A first gate dielectric layer 526 and a first gate electrode layer 528 may be formed over a portion of the second p-well 118, the first p-well 108 and the field oxide layer 122. The formation of the first gate dielectric layer 526 and the first gate electrode layer 528 includes forming a layer of gate dielectric material 184 and gate electrode material 186, similar to the fabrication process shown in FIG. 6E. The gate dielectric material layer 184 and the gate electrode material layer 186 may be patterned by a conventional photolithography process followed by a wet or dry etch to leave behind a portion of the gate dielectric material layer 184 and the gate electrode material layer 186 over a portion of the second p-well 118, the first p-well 108 and the field oxide layer 122, thereby forming the first gate dielectric layer 526 and the first gate electrode layer 528, respectively. A p+ anode region 112 may be formed in the second n-well 110. A p+ doped region 148 may be formed in the second p-well 118. A p+ doped region 124 may be formed in the substrate 102. An n+ doped region 132 may be formed in the first n-well 106. An n+ doped region 114 may be formed in the second n-well 110. An n+ cathode region 120 may be formed in the second p-well 118. The formation of a p+ anode region 112, n+ doped regions 114 and 132, an n+ cathode region 120, p+ doped regions 124 and 148 is similar to the fabrication process shown in FIG. 6F. A silicide block layer 150 may be formed over the p+ anode region 112 and the n+ doped region 114. The formation of the silicide block layer 150 is similar to the fabrication process shown in FIG. 1A.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A silicon controlled rectifier comprising:
   a substrate and a first n-well in the substrate;
   a p+ anode region in the first n-well;
   a first p-well in the first n-well;
   an n+ cathode region in the first p-well;
   a field oxide layer over a first portion of the first p-well and a portion of the first n-well adjacent to the first portion of the first p-well; and
   a first gate electrode layer over a portion of the field oxide layer and extending over a second portion of the first p-well.

2. The silicon controlled rectifier of claim 1, further comprising:
   a second n-well in the first n-well, wherein the p+ anode region is in the second n-well and the field oxide layer is over a first portion of the second n-well adjacent to the p+ anode region.

3. The silicon controlled rectifier of claim 2 further comprising:
   a second p-well in the first p-well, wherein the n+ cathode region is in the second p-well.

4. The silicon controlled rectifier of claim 3 further comprising:
   a second gate electrode layer over a portion of the second p-well adjacent to the n+ cathode region.

5. The silicon controlled rectifier of claim 3, wherein the first gate electrode layer extends over a portion of the second p-well adjacent to the n+ cathode region.

6. The silicon controlled rectifier of claim 2 further comprising:
   an n+ doped region in the second n-well.

7. The silicon controlled rectifier of claim 6 further comprising:
   a silicide block layer over the p+ anode region and the n+ doped region.

8. The silicon controlled rectifier of claim 6 further comprising:
   an isolation region between the n+ doped region and the p+ anode region.

9. The silicon controlled rectifier of claim 6 further comprising:
   a second portion of the second n-well between the n+ doped region and the p+ anode region.

10. The silicon controlled rectifier of claim 9 further comprising:
    a silicide block layer over the n+ doped region, the p+ anode region and the second portion of the second n-well between the n+ doped region and the p+ anode region.

11. The silicon controlled rectifier of claim 1 further comprising:
    a second n-well in the first p-well, wherein the p+ anode region is in the second n-well and the field oxide layer is over a portion of the second n-well adjacent to the p+ anode region.

12. The silicon controlled rectifier of claim 1, wherein the first gate electrode layer is spaced from the n+ cathode region.

13. A silicon controlled rectifier comprising:
    a substrate and a first n-well in the substrate;
    a p+ anode region in the first n-well;
    a first p-well in the first n-well;
    an n+ cathode region in the first p-well;
    a field oxide layer over a first portion of the first p-well and a portion of the first n-well adjacent to the first portion of the first p-well;
    a first gate electrode layer extending over a second portion of the first p-well and over a portion of the field oxide layer;
    a gate dielectric layer between the first gate electrode layer and the second portion of the first p-well; and
    a p+ doped region in the first p-well.

14. The silicon controlled rectifier of claim 13 further comprising:
    a second p-well in the first p-well, wherein the n+ cathode region and the p+ doped region are in the second p-well.

15. The silicon controlled rectifier of claim 14 further comprising:
    a second gate electrode layer over a portion of the second p-well adjacent to the n+ cathode region.

16. The silicon controlled rectifier of claim 15, wherein a portion of the first p-well is between the first gate electrode layer and the second gate electrode layer.

17. The silicon controlled rectifier of claim 13 further comprising:
    a second n-well in the first n-well, wherein the p+ anode region is in the second n-well and the field oxide layer is over a portion of the second n-well adjacent to the p+ anode region.

18. A method of fabricating a silicon controlled rectifier comprising:
    forming a first n-well in a substrate;
    forming a first p-well in the first n-well;
    forming a field oxide layer over a first portion of the first p-well and a portion of the first n-well adjacent to the first portion of the first p-well;
    forming a first gate electrode layer over a second portion of the first p-well and over a portion of the field oxide layer;
    forming a p+ anode region in the first n-well; and
    forming an n+ cathode region in the first p-well.

19. The method of claim 18, wherein forming the p+ anode region further comprises forming a second n-well in the first n-well and the p+ anode region is formed in the second n-well.

20. The method of claim 19, wherein forming the n+ cathode region further comprises forming a second p-well in the first p-well and the n+ cathode region is formed in the second p-well.

* * * * *